(12) United States Patent
Sato et al.

(10) Patent No.: US 11,973,011 B2
(45) Date of Patent: Apr. 30, 2024

(54) SEMICONDUCTOR MODULE

(71) Applicant: FUJI ELECTRIC CO., LTD., Kawasaki (JP)

(72) Inventors: Tadahiko Sato, Matsumoto (JP); Kenichiro Sato, Shiojiri (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 308 days.

(21) Appl. No.: 17/215,950

(22) Filed: Mar. 29, 2021

(65) Prior Publication Data
US 2021/0217688 A1 Jul. 15, 2021

Related U.S. Application Data

(63) Continuation of application No. PCT/JP2020/009109, filed on Mar. 4, 2020.

(30) Foreign Application Priority Data

Apr. 1, 2019 (JP) .................................. 2019-069846

(51) Int. Cl.
*H01L 23/495* (2006.01)
*H01L 23/00* (2006.01)
(Continued)

(52) U.S. Cl.
CPC .. *H01L 23/49575* (2013.01); *H01L 23/49517* (2013.01); *H01L 24/48* (2013.01);
(Continued)

(58) Field of Classification Search
CPC ......... H01L 23/79575; H01L 23/79517; H01L 24/48; H01L 25/18; H01L 29/1608;
(Continued)

(56) References Cited

U.S. PATENT DOCUMENTS

2008/0017882 A1* 1/2008 Nakanishi ............... H01L 24/73
 257/E25.031
2014/0184303 A1* 7/2014 Hasegawa .............. H03K 17/12
 327/377
(Continued)

FOREIGN PATENT DOCUMENTS

JP H4-354156 A 12/1992
JP 2002-165439 A 6/2002
(Continued)

OTHER PUBLICATIONS

International Search Report for PCT/JP2020/009109, dated May 26, 2020.
Written Opinion for PCT/JP2020/009109, dated May 26, 2020.

*Primary Examiner* — Marc Anthony Armand
(74) *Attorney, Agent, or Firm* — Rabin & Berdo, P.C.

(57) ABSTRACT

A semiconductor module, including a metal-oxide-semiconductor field effect transistor (MOSFET) made of a SiC semiconductor material, and an insulated gate bipolar transistor (IGBT) that is made of a Si semiconductor material and is connected in parallel with the MOSFET. The MOSFET having a body diode. The IGBT is a reverse conductive-IGBT (RC-IGBT), and includes a free wheeling diode. A forward voltage of the free wheeling diode is so set that a current in the body diode of the MOSFET, which is connected in parallel with the RC-IGBT, is equal to or below a current value that causes lattice defects to grow in the MOSFET.

10 Claims, 11 Drawing Sheets

(51) Int. Cl.
*H01L 25/18* (2023.01)
*H01L 29/16* (2006.01)

(52) U.S. Cl.
CPC .......... *H01L 25/18* (2013.01); *H01L 29/1608* (2013.01); *H01L 2224/48245* (2013.01); *H01L 2224/4917* (2013.01); *H01L 2924/13055* (2013.01); *H01L 2924/13091* (2013.01)

(58) Field of Classification Search
CPC ....... H01L 224/48245; H01L 224/4917; H01L 224/13055; H01L 224/13091
See application file for complete search history.

(56) References Cited

U.S. PATENT DOCUMENTS

| | | | |
|---|---|---|---|
| 2016/0011266 A1 | 1/2016 | Osanai | |
| 2016/0181792 A1* | 6/2016 | Iwamizu | H02H 9/02 361/93.9 |
| 2018/0145683 A1 | 5/2018 | Shimizu et al. | |
| 2018/0269872 A1 | 9/2018 | Basler et al. | |
| 2018/0287510 A1 | 10/2018 | Saha et al. | |
| 2018/0375508 A1 | 12/2018 | Morisaki et al. | |
| 2019/0355633 A1 | 11/2019 | Liu et al. | |
| 2020/0203513 A1* | 6/2020 | Konrath | H01L 29/0696 |
| 2020/0266727 A1* | 8/2020 | Tsuchimochi | H02M 7/53875 |

FOREIGN PATENT DOCUMENTS

| | | |
|---|---|---|
| JP | 2012-253202 A | 12/2012 |
| JP | 2014-130909 A | 7/2014 |
| JP | 2014-195082 A | 10/2014 |
| JP | 2016-012647 A | 1/2016 |
| JP | 2016-021652 A | 2/2016 |
| JP | 2018-085786 A | 5/2018 |
| JP | 2018-164078 A | 10/2018 |
| JP | 2018-201335 A | 12/2018 |
| WO | 2017/026367 A1 | 2/2017 |
| WO | 2017/086201 A1 | 5/2017 |
| WO | 2018/141811 A1 | 8/2018 |

* cited by examiner

SEMICONDUCTOR MODULE

CROSS-REFERENCE TO RELATED APPLICATION

This application is a continuation application of International Application PCT/JP2020/009109 filed on Mar. 4, 2020 which designated the U.S., which claims priority to Japanese Patent Application No. 2019-069846, filed on Apr. 1, 2019, the entire contents of which are incorporated herein by reference.

BACKGROUND OF THE INVENTION

1. Field of the Invention

The embodiments discussed herein relate to a semiconductor module constructed by connecting a plurality of semiconductor chips with different characteristics in parallel.

2. Background of the Related Art

Switching power supplies use a half-bridge circuit in which semiconductor switching elements are connected in a cascade arrangement. As the semiconductor switching elements used here, a semiconductor module in which a plurality of voltage-controlled semiconductor chips with different characteristics are combined to produce the desired characteristics is known (see, for example, Japanese Laid-open Patent Publication No. 04-354156). An example configuration of the semiconductor module disclosed in Japanese Laid-open Patent Publication No. 04-354156 will now be described.

FIG. 9 is a circuit diagram depicting an example configuration of a conventional semiconductor module, FIG. 10 depicts example characteristics of a conventional semiconductor module, and FIG. 11 is a circuit diagram depicting an example configuration of a conventional semiconductor module that solves the problem of deterioration in characteristics due to the growth of lattice defects when a SiC-MOSFET is used.

The semiconductor module 100 depicted in FIG. 9 is constructed by connecting a MOSFET (Metal-Oxide-Semiconductor Field-Effect Transistor) 101 and an IGBT (Insulated Gate Bipolar Transistor) 102 in parallel. In more detail, the drain of the MOSFET 101 is connected to the collector of the IGBT 102, and the source of the MOSFET 101 is connected to the emitter of the IGBT 102. The diode connected in antiparallel to the MOSFET 101 in the drawing is a body diode 101a incorporated in the MOSFET 101.

As depicted in FIG. 10, this semiconductor module 100 has a characteristic 130 that is a combination of an on-resistance characteristic 110 of the MOSFET 101 and a characteristic 120 of the IGBT 102. In FIG. 10, the horizontal axis represents a drain-source voltage Vds of the MOSFET 101 or a collector-emitter voltage Vce of the IGBT 102, and the vertical axis represents a drain current Ids of the MOSFET 101 or a collector current Ice of the IGBT 102. Since the on-resistance characteristic 110 of the MOSFET 101 is a constant resistance characteristic that allows a current proportional to the voltage to flow, the characteristic 110 is represented by a straight line with a constant slope. The characteristic 120 of the IGBT 102 is diode-like in that no current flows in a low voltage region and there is little voltage drop in the large current region. By combining the on-resistance characteristic 110 and the characteristic 120, the semiconductor module 100 has the characteristic indicated as the characteristic 130 and may therefore construct a semiconductor switching element with low loss from the small current region to the large current region.

In recent years, MOSFETs made of SiC semiconductor materials (hereinafter referred to as "SiC-MOSFETs") have become available. A SiC-MOSFET has a lower on-resistance than a MOSFET made of a Si semiconductor material. This means that replacing the MOSFET 101 made of a Si semiconductor material in the semiconductor module 100 with a SiC-MOSFET will produce a semiconductor module with even lower loss. Alternatively, for MOSFETs with the same on-resistance, a SiC-MOSFET will enable the chip size to be further reduced.

The semiconductor module 105 depicted in FIG. 11 is constructed by connecting a SiC-MOSFET 106 and an IGBT 102 in parallel. The SiC-MOSFET 106 incorporates a body diode 106a that is connected in antiparallel and also has a Schottky barrier diode 107 connected in antiparallel. The Schottky barrier diode 107 protects the body diode 106a of the MOSFET 106. The reason why such protection is used is described below.

As one example, the semiconductor module 105 may be used as the semiconductor switching elements that construct a half-bridge circuit of a switching power supply. In a configuration where a half-bridge circuit drives an inductive load, such as a motor or transformer, connected in parallel to the low-side semiconductor switching element, a current may flow through the body diode 106a of the MOSFET 106. When the semiconductor switching element on the high side of the half-bridge circuit turns on and supplies current to the inductive load such as a motor or a transformer, and then the high-side semiconductor switching element is turned off, the current that has been flowing through the inductive load will try to continue flowing. When this happens, the current that has been flowing through the inductive load will circulate in the opposite direction through the body diode of the semiconductor switching element on the low side.

It is known that when a forward current flows through the body diode 106a of the SiC-MOSFET 106, lattice defects in the MOSFET will grow (see, for example, Japanese Laid-open Patent Publication No. 2014-195082 (paragraph [0002])). When defects grow due to current passing through the body diode 106a, the forward voltage characteristic of the body diode 106a and the on-resistance characteristic of the MOSFET will deteriorate, which shortens the life of the MOSFET and in turn the life of a semiconductor module.

To suppress growth of defects due to current passing through the body diode 106a, it is sufficient to prevent current flowing through the body diode 106a. For this reason, Japanese Laid-open Patent Publication No. 2014-195082 uses a configuration where a Schottky barrier diode is connected to the MOSFET in antiparallel. The Schottky barrier diode 107 included in the semiconductor module 105 corresponds to the Schottky barrier diode described in Japanese Laid-open Patent Publication No. 2014-195082.

However, this configuration where a Schottky barrier diode is connected to a SiC-MOSFET in antiparallel means that another type of semiconductor chip is mounted on the semiconductor module, resulting in cost increases due to the increase in the number of chips and an increase in module volume. The current flowing through the body diode could also be reduced by performing so-called synchronous rectification where the MOSFET is turned on at timing where a current flows through the body diode of the SiC-MOSFET. However, this method also has problems such as the dead time taken until the MOSFET turns on and the difficulty in turning on a MOSFET during abnormal operation.

SUMMARY OF THE INVENTION

According to an aspect, there is provided a semiconductor module including: a metal-oxide-semiconductor field effect transistor (MOSFET) made of a SiC semiconductor material, the MOSFET having a body diode; and an insulated gate bipolar transistor (IGBT) that is made of a Si semiconductor material and is connected in parallel with the MOSFET, wherein the IGBT is a reverse conductive-IGBT (RC-IGBT), and includes a free wheeling diode, and a forward voltage of the free wheeling diode is so set that a current in the body diode of the MOSFET, which is connected in parallel with the RC-IGBT, is equal to or below a current value that causes lattice defects to grow in the MOSFET.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
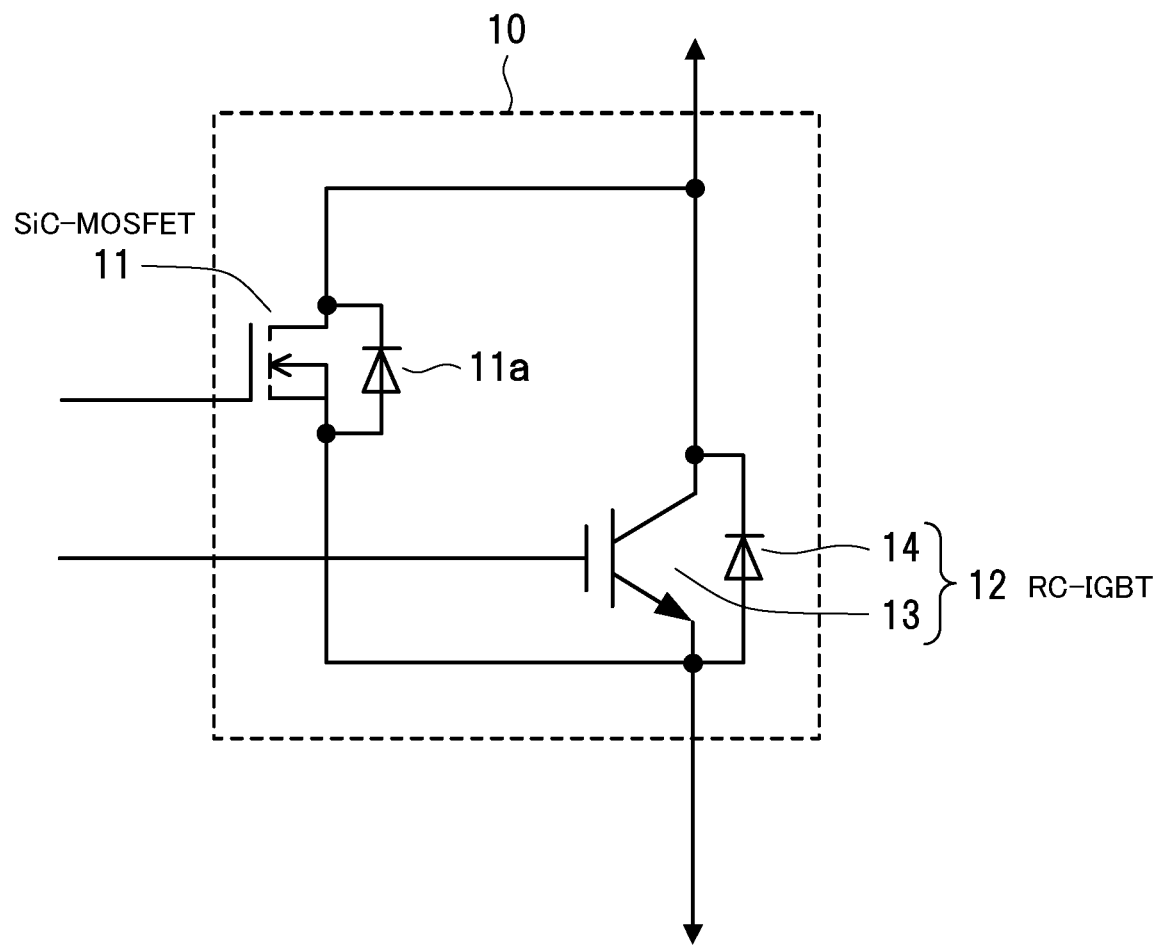
FIG. 1 is a circuit diagram depicting an example configuration of a semiconductor module according to a first embodiment.

Several embodiments will be described below with reference to the accompanying drawings. Note that parts assigned the same reference numerals indicate the same elements.

Figure 2:
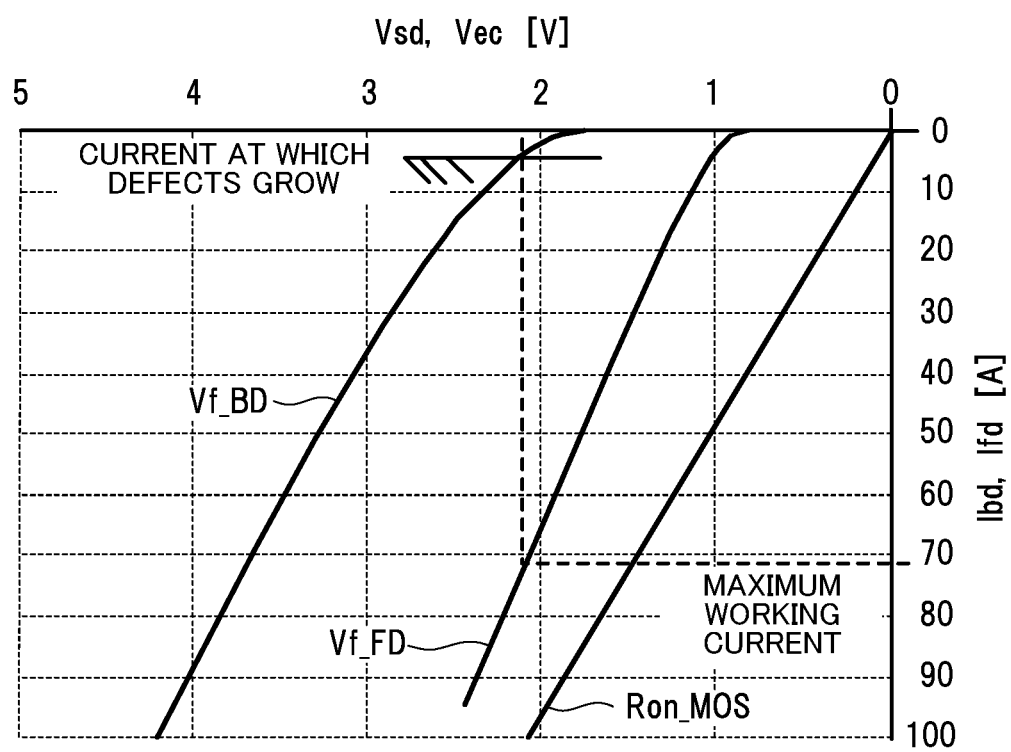
FIG. 2 depicts example characteristics of the semiconductor module.

FIG. 1 is a circuit diagram depicting an example configuration of a semiconductor module according to a first embodiment, and FIG. 2 depicts example characteristics of the semiconductor module. Note that FIG. 2 depicts the current-voltage characteristic of a current that flows through the semiconductor module in the opposite direction.

A semiconductor module 10 according to the first embodiment is constructed by connecting a SiC-MOSFET 11 and an RC-IGBT (reverse conductive-IGBT) 12 made of a Si semiconductor material in parallel. The SiC-MOSFET 11 has a built-in body diode 11a. The RC-IGBT 12 is a single chip incorporating the IGBT 13 and a free wheeling diode 14. This means that the semiconductor module 10 includes two types of semiconductor chips.

In the semiconductor module 10, the drain of the SiC-MOSFET 11 is connected to the collector of the RC-IGBT 12 and is a terminal through which the main current flows. The source of the SiC-MOSFET 11 is connected to the emitter of the RC-IGBT 12 and is another terminal through which the main current flows.

In this semiconductor module 10, the free wheeling diode 14 prevents deterioration of the body diode 11a by allowing any current that would flow in the forward direction of the body diode 11a of the SiC-MOSFET 11 to pass through the free wheeling diode 14 of the RC-IGBT 12. For this to happen, as depicted in FIG. 2, for the operating conditions (temperature, current) of the semiconductor module 10, the forward voltage of the free wheeling diode 14 in the RC-IGBT 12 has a characteristic of always being equal to or lower than a forward voltage corresponding to a current at which lattice defects grow in the body diode 11a of the SiC-MOSFET 11. As a result, the current flowing through the body diode 11a of the SiC-MOSFET 11 may be reduced to near zero regardless of temperature and tolerances in the manufacturing process, which suppresses growth of lattice defects in the SiC-MOSFET 11.

In FIG. 2, the horizontal axis depicts the source-drain voltage Vsd of the SiC-MOSFET 11 and the emitter-collector voltage Vec of the RC-IGBT 12. The vertical axis of FIG. 2 depicts the current Ibd flowing through the body diode 11a of the SiC-MOSFET 11 and the current Ifd flowing through the free wheeling diode 14 of the RC-IGBT 12.

FIG. 2 depicts curves of an on-resistance characteristic Ron_MOS of the SiC-MOSFET 11, a forward voltage characteristic Vf_FD of the free wheeling diode 14 of the RC-IGBT 12, and a forward voltage characteristic Vf_BD of the body diode 11a of the SiC-MOSFET 11. As one example, it is assumed here that the current Ibd that causes lattice defects to grow in the body diode 11a of the SiC-MOSFET 11 is 5 amperes (A) or higher. With the numerical example depicted in FIG. 2, the source-drain voltage Vsd at this time is around 2.1 volts (V), and when the emitter-collector voltage Vec is 2.1 V, the current Ifd of the free wheeling diode 14 is around 72 A. From this, it may be understood that when the maximum working current in the reverse direction that may flow through the semiconductor module 10 is set at 72 A, a current in excess of 5 A will not flow through the body diode 11a, which suppresses deterioration in the characteristics due to current passing through the body diode 11a.

In the semiconductor module 10, since the SiC-MOSFET has a low on-resistance and the body diode 11a operates in a low current region, it is possible to reduce the chip size. Since the function of the free wheeling diode 14 is added to a switching element made of a Si semiconductor material, which is inexpensive compared to a costly SiC-MOSFET, it is possible to suppress cost increases for the semiconductor module 10 caused by the addition of this function.

Figure 3:
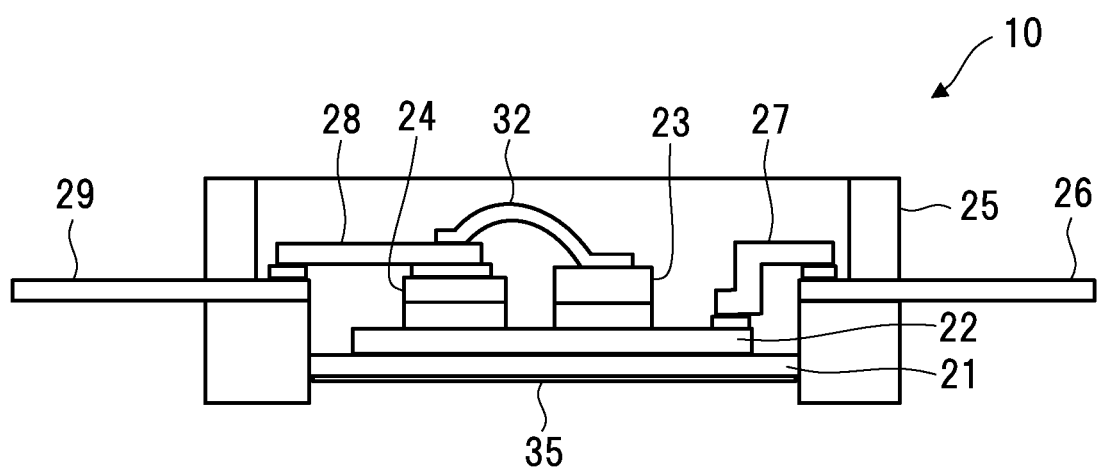
FIG. 3 is a cross-sectional view depicting an example of the internal structure of the semiconductor module according to the first embodiment.
Figure 4:
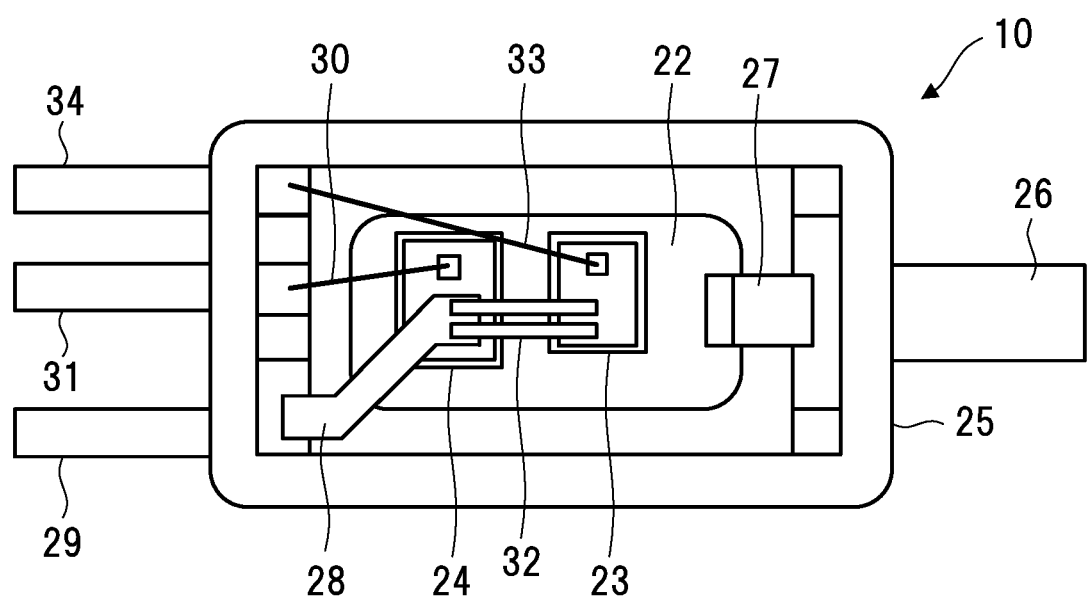
FIG. 4 is a plan view depicting an example of the internal structure of the semiconductor module according to the first embodiment.

FIG. 3 is a cross-sectional view depicting an example of the internal structure of the semiconductor module according to the first embodiment, and FIG. 4 is a plan view depicting an example of the internal structure of the semiconductor module according to the first embodiment.

The semiconductor module 10 has an insulating substrate 21 made of ceramic. A copper pattern 22 is bonded to the front surface (the upper surface in FIG. 3) of the insulating substrate 21, and copper foil 35 is bonded to the entire rear surface of the insulating substrate 21. On the surface of the copper pattern 22, a SiC chip 23 for the SiC-MOSFET 11 and a Si chip 24 for the RC-IGBT 12 are bonded by soldering at predetermined positions. Since the SiC chip 23 has a greater thickness than the Si chip 24, the respective chips have different heights. The copper pattern 22 is also connected by a lead frame 27 to an external terminal 26 that is fixed to a case 25. With this configuration, the drain of the SiC-MOSFET 11 and the collector of the RC-IGBT 12 are electrically connected to the copper pattern 22, and the copper pattern 22 is electrically connected by the lead frame 27 to the external terminal 26 through which the main current flows.

The main electrode on the upper surface of the Si chip 24 is connected by a lead frame 28 to an external terminal 29 that is fixed to the case 25, and a control pad is connected by a bonding wire 30 to an external terminal 31 that is fixed to the case 25. The main electrode on the upper surface of the SiC chip 23 is connected to the lead frame 28 by a plurality of bonding wires 32, and a control pad is connected by a bonding wire 33 to an external terminal 34 that is fixed to the case 25. The bonding wires 32 are connected to the lead frame 28 at positions directly above the Si chip 24. As a result, the source of the SiC-MOSFET 11 and the emitter of the RC-IGBT 12 are electrically connected by the bonding wires 32 and the lead frame 28 to the external terminal 29 through which the main current flows.

In this semiconductor module 10, the main electrode of the Si chip 24 is connected using the lead frame 28 that has a large current capacity and small inductance, and the main electrode of the SiC chip 23 is connected using the bonding wires 32. In this configuration, the external terminal 29 is electrically connected to the SiC chip 23 via the lead frame 28 plus the bonding wires 32. This means that from the viewpoint of the external terminal 29, the SiC chip 23 has a larger wiring inductance and larger wiring resistance than the Si chip 24. As a result, it is easier for a current that flows through the semiconductor module 10 in the reverse direction to flow through the Si chip 24 than through the SiC chip 23. In addition, the main electrode of the SiC chip 23 is connected using the bonding wires 32. By using this configuration, even when the SiC chip 23 has a small chip size, it is easier to wire up with the bonding wires 32 than by using the lead frame 28. When the lead frame 28 is used to make connections, as the chip size becomes smaller, it becomes progressively more difficult to accurately position the lead frame 28 on the main electrode of the SiC chip 23 while avoiding a guard ring or a withstand voltage structure. Also, since the SiC chip 23 has a different thickness to the Si chip 24, when the SiC chip 23 and the Si chip 24 are wired using the lead frame 28, it would be needed to accurately position the lead frame 28 with consideration to the thicknesses of the chips and the applied tolerances of the solder above and below the chips, which makes mounting difficult.

Note that the copper foil 35 bonded to the entire rear surface of the insulating substrate 21 is bonded to a metal plate (not illustrated) using solder. This metal plate is attached and thermally coupled to a heat sink, and so may dissipate heat generated in the semiconductor module 10 to the periphery.

Also, although the semiconductor module 10 is equipped with one SiC-MOSFET 11 and one RC-IGBT 12 in the embodiment described here, a plurality of SiC-MOSFETs 11 may be mounted in parallel in keeping with the desired characteristics.

Figure 5:
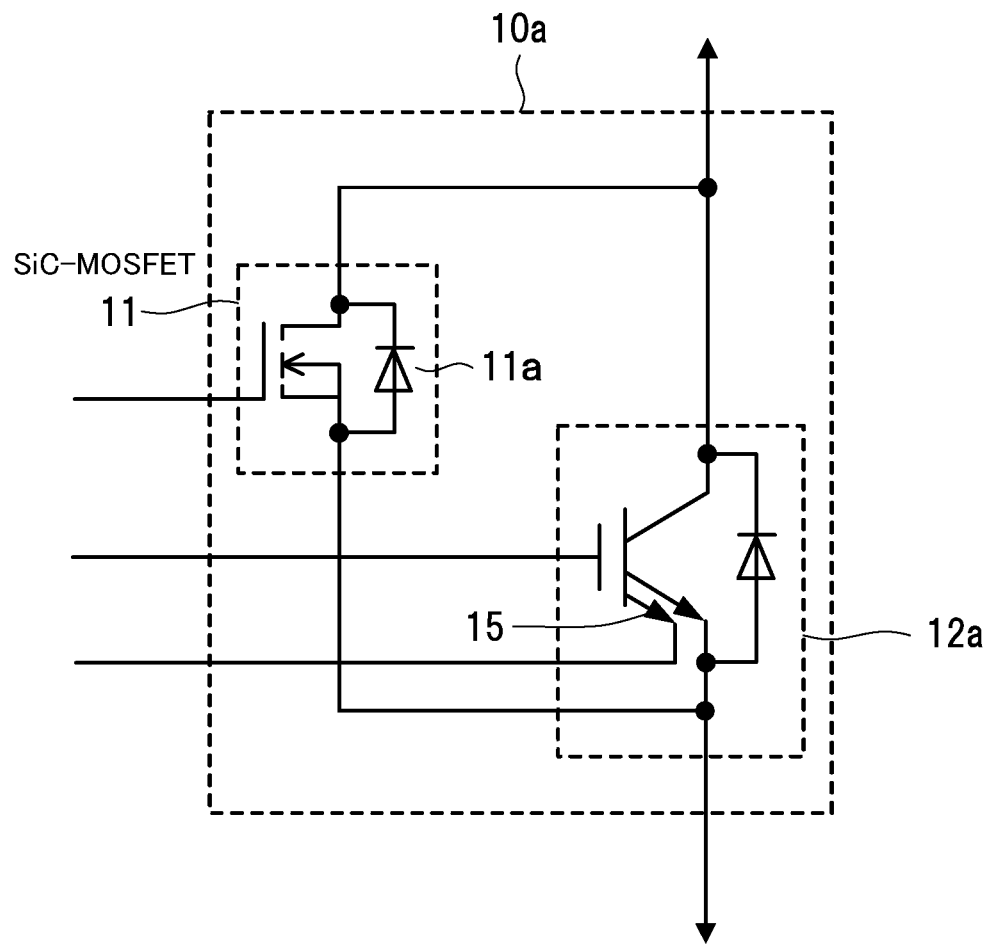
FIG. 5 is a circuit diagram depicting an example configuration of a semiconductor module according to a second embodiment.
Figure 6:
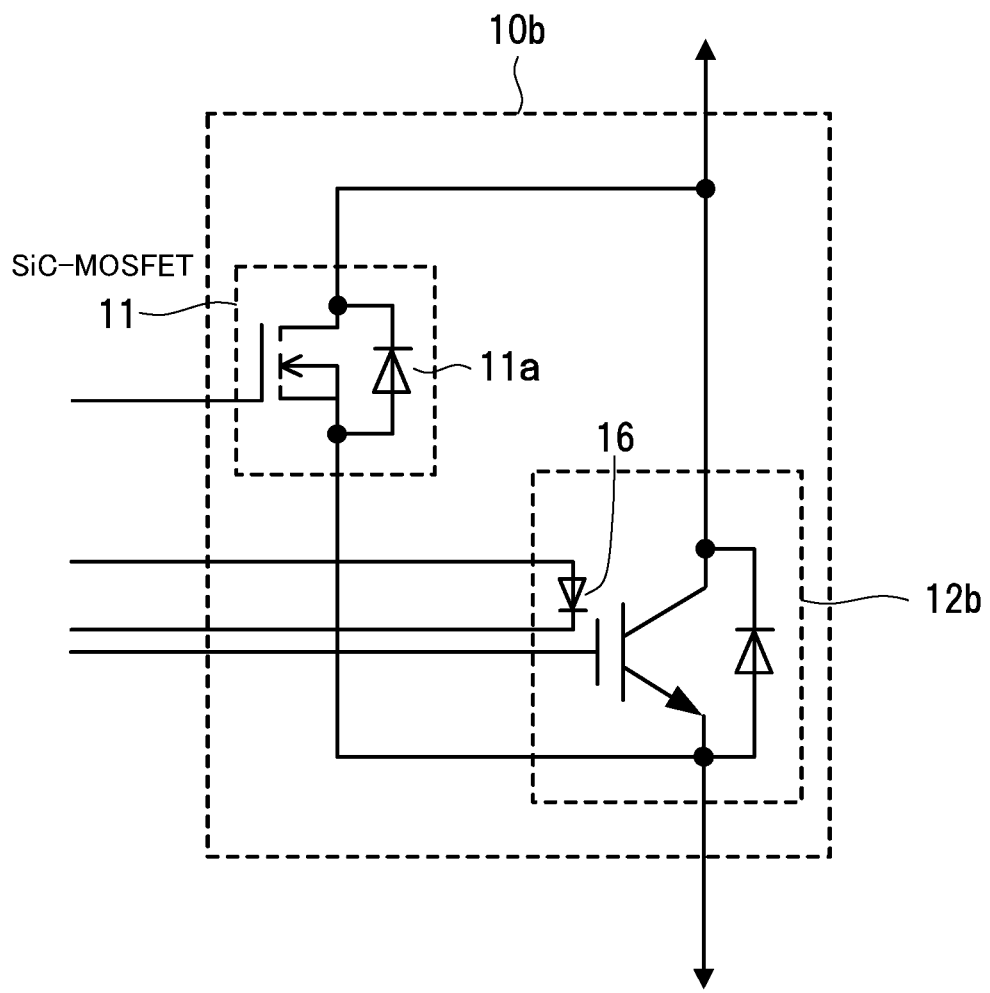
FIG. 6 is a circuit diagram depicting an example configuration of a semiconductor module according to a third embodiment.
Figure 7:
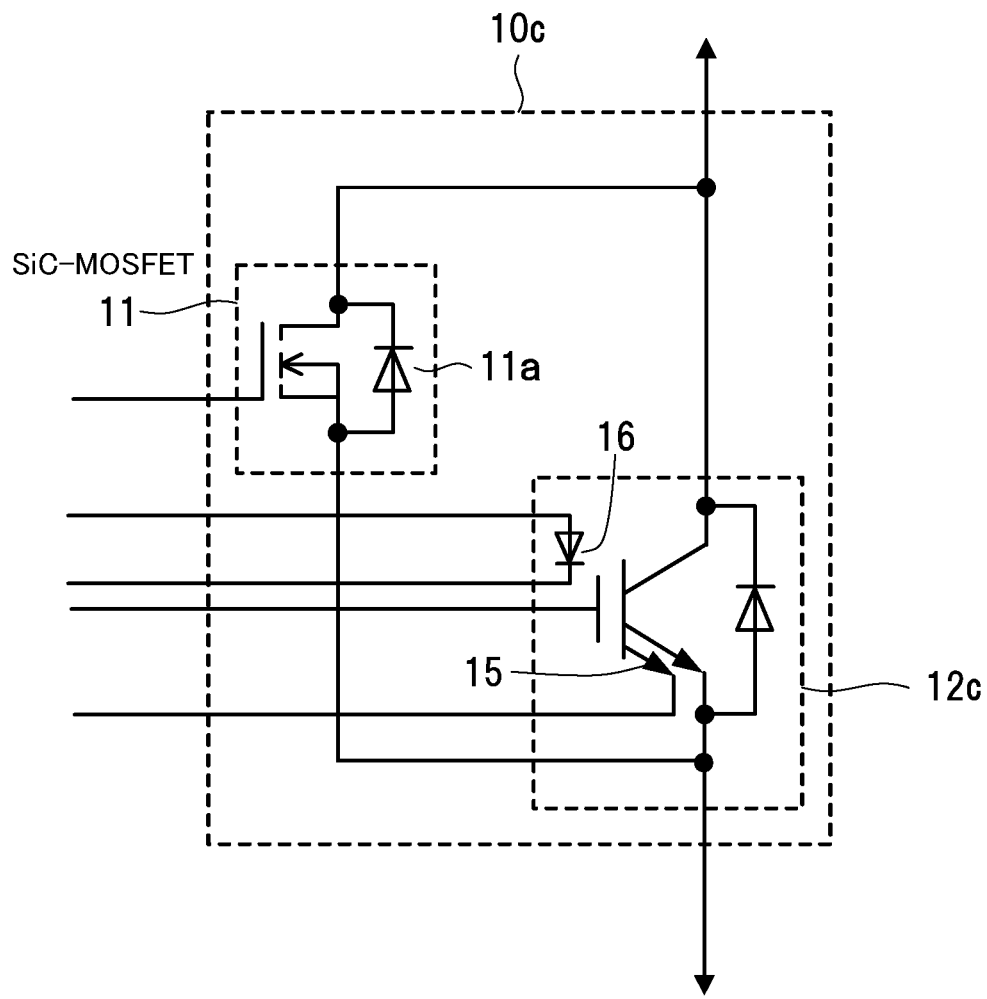
FIG. 7 is a circuit diagram depicting an example configuration of a semiconductor module according to a fourth embodiment.
Figure 8:
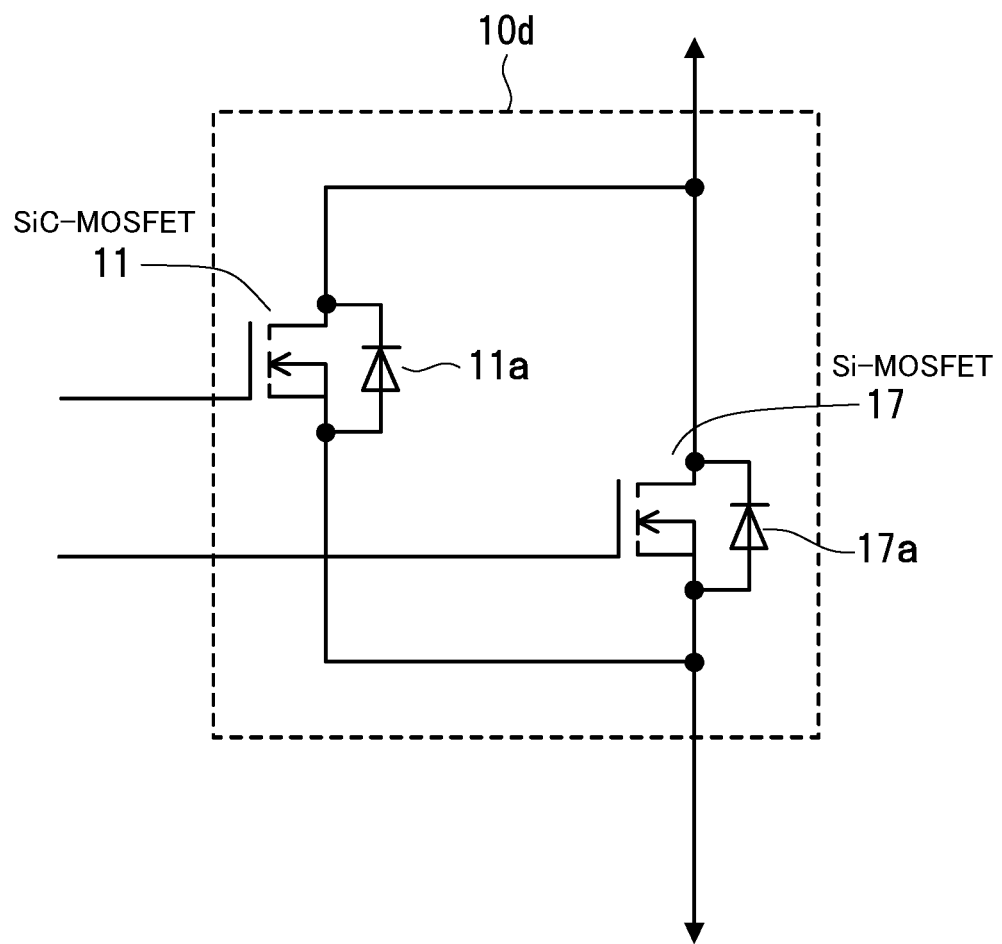
FIG. 8 is a circuit diagram depicting an example configuration of a semiconductor module according to a fifth embodiment.
Figure 9:
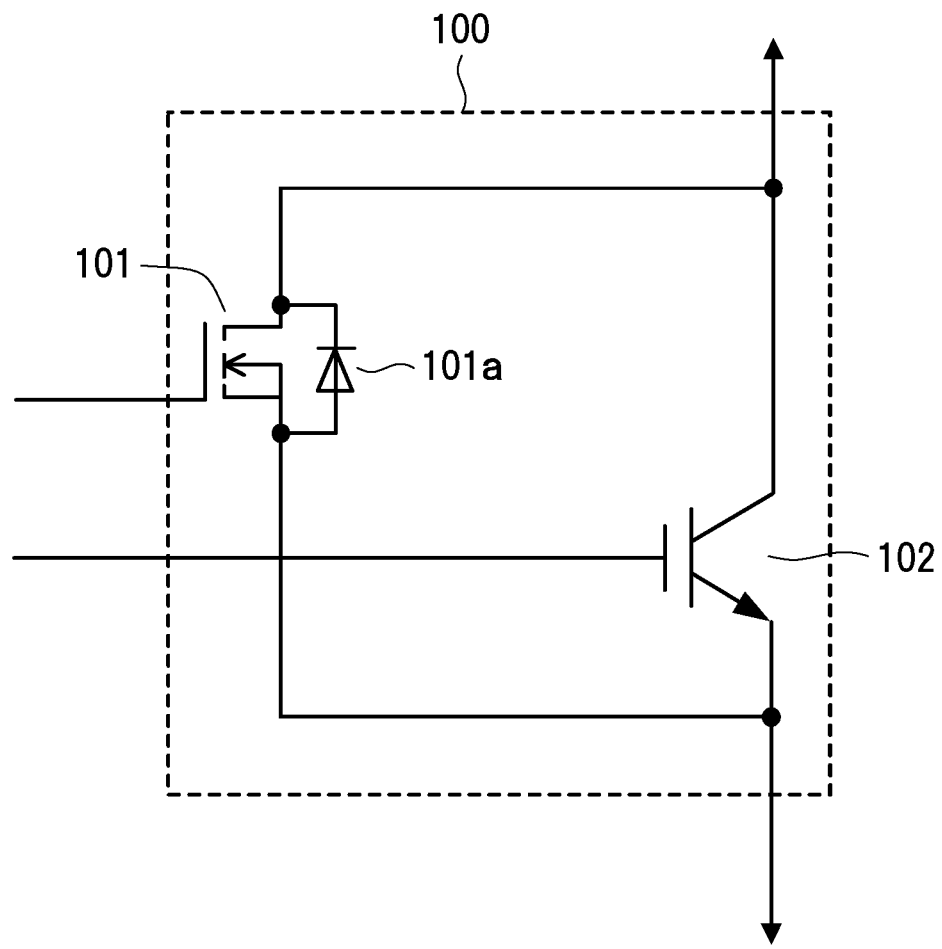
FIG. 9 is a circuit diagram depicting an example configuration of a conventional semiconductor module.
Figure 10:
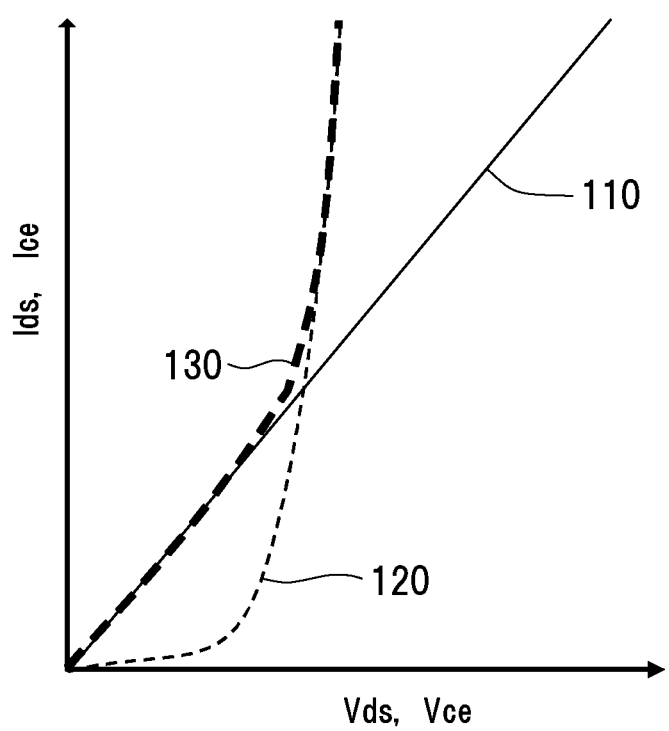
FIG. 10 depicts example characteristics of a conventional semiconductor module.
Figure 11:
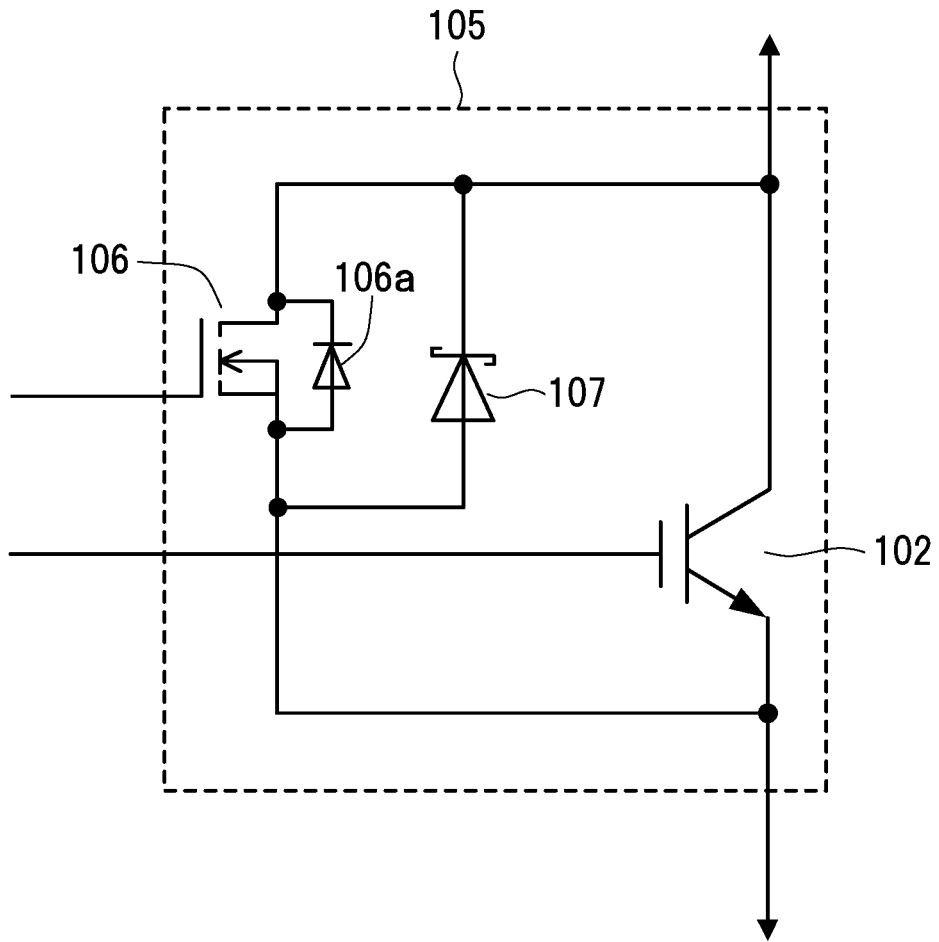
FIG. 11 is a circuit diagram depicting an example configuration of a conventional semiconductor module that solves the problem of deterioration in characteristics due to the growth of lattice defects when a SiC-MOSFET is used.

FIG. 5 is a circuit diagram depicting an example configuration of a semiconductor module according to a second embodiment, and FIG. 6 is a circuit diagram depicting an example configuration of a semiconductor module according to a third embodiment. FIG. 7 is a circuit diagram depicting an example configuration of a semiconductor module according to a fourth embodiment, and FIG. 8 is a circuit diagram depicting an example configuration of a semiconductor module according to a fifth embodiment.

As depicted in FIG. 5, a semiconductor module 10a according to the second embodiment includes an RC-IGBT 12a with a current sensing function. In the semiconductor module 10a, since the RC-IGBT 12a handles the large current region, a current sensing function is provided in only the RC-IGBT 12a.

This RC-IGBT 12a is configured by mounting a sensing IGBT as a current sensing element on a main RC-IGBT chip (which is the same as the RC-IGBT 12 in FIG. 1). The collector and the gate of the sensing IGBT share the same connections as the main RC-IGBT, but the emitter of the main RC-IGBT and a sensing emitter 15 are independently provided on the outside. Note that in FIG. 5, the main RC-IGBT and the sensing IGBT are represented by one symbol labelled as the RC-IGBT 12a. Accordingly, in addition to the terminals for the main current and the control terminal, the RC-IGBT 12a is further provided with an external terminal for current detection.

With this semiconductor module 10a, a current that is substantially proportional to the collector current of the main RC-IGBT is outputted from the sensing emitter 15 as a sensing current. This means that by detecting the sensing current, the collector current of the main RC-IGBT is able to be estimated.

As depicted in FIG. 6, a semiconductor module 10b according to the third embodiment includes an RC-IGBT 12b with a temperature sensing function. In the semiconductor module 10b, since the RC-IGBT 12b handles the large current region and generates a large amount of heat, the temperature sensing function is provided in only the RC-IGBT 12b.

In this RC-IGBT 12b, a diode 16 is formed as a temperature sensing element on part of an RC-IGBT chip (which is the same as the RC-IGBT 12 in FIG. 1). The temperature sensing function uses the negative temperature coefficient of the forward voltage of the diode 16 and is able to detect the temperature of the RC-IGBT 12b by detecting changes in the current flowing through the diode 16. Accordingly, in addition to the terminals for the main current and the control terminal, the RC-IGBT 12b is further provided with two external terminals for temperature detection.

As depicted in FIG. 7, a semiconductor module 10c according to the fourth embodiment includes an RC-IGBT 12c with a current sensing function and a temperature sensing function. In this RC-IGBT 12c, a diode 16 is formed as a temperature sensing element on part of the main RC-IGBT and a sensing IGBT chip. This means that by detecting the sensing current outputted from the sensing emitter 15, it is possible to estimate the collector current of the main RC-IGBT, and by detecting changes in the current flowing through the diode 16, it is possible to detect the chip temperature of the RC-IGBT 12c. Accordingly, in addition to the terminals for the main current and the control terminal, the RC-IGBT 12c is further provided with three external terminals for current detection and temperature detection.

As depicted in FIG. 8, a semiconductor module 10d according to the fifth embodiment is a MOSFET 17 (hereinafter referred to as the "Si-MOSFET") made of a Si semiconductor material in place of the RC-IGBT 12 made of a Si semiconductor material in FIG. 1. That is, the semiconductor module 10d is configured with the voltage-controlled SiC-MOSFET 11 and the Si-MOSFET 17 connected in parallel. Note that the diode connected in antiparallel to the Si-MOSFET 17 in FIG. 8 is a body diode 17a incorporated in the Si-MOSFET 17.

According to the semiconductor module 10d, any current that is to flow in the forward direction through the body diode 11a of the SiC-MOSFET 11 is caused to flow through the body diode 17a of the Si-MOSFET 17. The forward voltage of the body diode 17a of the Si-MOSFET 17 is equal to or lower than a forward voltage corresponding to the current at which lattice defects grow in the body diode 11a of the SiC-MOSFET 11. Accordingly, deterioration of the body diode 11a due to current flowing through the body diode 11a of the SiC-MOSFET 11 may be prevented by the body diode 17a of the Si-MOSFET 17. In addition, in the same way as the RC-IGBT 12 used in the first to fourth embodiments, the Si-MOSFET 17 does not need to additionally provide another semiconductor chip (i.e., a diode).

Since the semiconductor modules of the configurations described above may reduce the current flowing through the body diode of the SiC-MOSFET to almost zero regardless of temperature and tolerances in the manufacturing process, there is a merit in that growth of lattice defects in the SiC-MOSFET may be suppressed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor module, comprising:
   a metal-oxide-semiconductor field effect transistor (MOSFET) made of a SiC semiconductor material, the MOSFET having a body diode; and
   an insulated gate bipolar transistor (IGBT) that is made of a Si semiconductor material and is connected in parallel with the MOSFET, wherein
   the IGBT is a reverse conductive-IGBT (RC-IGBT), and includes a free wheeling diode, and
   the free wheeling diode is electrically connected in parallel to the body diode of the MOSFET, so as to turn on and off together with the body diode of the MOSFET, a forward voltage of the free wheeling diode being so set that, when a current flowing through the body diode of the MOSFET is greater than or equal to a predetermined current value, the forward voltage is equal to or below a source-drain voltage of the MOSFET at the predetermined current value.

2. The semiconductor module according to claim 1, further comprising:
   an external terminal through which a main current flows, and
   a lead frame, wherein
   the RC-IGBT has an emitter that is connected by the lead frame to the external terminal, and
   the MOSFET has a source that is connected to the lead frame by a bonding wire.

3. The semiconductor module according to claim 2, wherein a position of the lead frame to which the bonding wire is connected is directly above the emitter of the RC-IGBT.

4. The semiconductor module according to claim 1, wherein a chip area of the MOSFET is smaller than a chip area of the RC-IGBT.

5. The semiconductor module according to claim 1, wherein a chip thickness of the MOSFET is greater than a chip thickness of the RC-IGBT.

6. The semiconductor module according to claim 1, wherein the RC-IGBT includes at least one of a temperature sensing element and a current sensing element.

7. A semiconductor module, comprising:
   a first voltage-controlled semiconductor chip, made of a SiC semiconductor material, and
   a second voltage-controlled semiconductor chip, made of a Si semiconductor material, the first and second voltage-controlled semiconductor chips being connected in parallel, wherein
   the first voltage-controlled semiconductor chip is a SiC-MOSFET having a body diode thereof, and
   the second voltage-controlled semiconductor chip is a Si-MOSFET having a body diode thereof, the body diode of the Si-MOSFET being electrically connected in parallel to the body diode of the SiC-MOSFET, so as to turn on and off together with the body diode of the SiC-MOSFET, a forward voltage of the body diode of the Si-MOSFET being so set that, when a current flowing through the body diode of the SiC-MOSFET is greater than or equal to a predetermined current value, the forward voltage is equal to or below a source-drain voltage of the Si-MOSFET at the predetermined current value.

8. The semiconductor module according to claim 1, wherein the predetermined current value is 5 amperes or higher, which causes lattice defects to grow in the body diode of the MOSFET.

9. The semiconductor module according to claim 7, wherein the predetermined current value is 5 amperes or higher, which causes lattice defects to grow in the body diode of the SiC-MOSFET.

10. The semiconductor module according to claim 1, wherein the RC-IGBT is a single chip incorporating the IGBT and the free wheeling diode.

* * * * *